United States Patent [19]

Ballentine, Jr.

[11] 4,434,378
[45] Feb. 28, 1984

[54] D.C. POWER MONITOR

[75] Inventor: Howard K. Ballentine, Jr., Clearwater, Fla.

[73] Assignee: Paradyne Corporation, Largo, Fla.

[21] Appl. No.: 318,742

[22] Filed: Nov. 6, 1981

[51] Int. Cl.³ .................. H03K 5/153; G01R 17/02; G01R 19/165

[52] U.S. Cl. .................. 307/350; 307/296 R; 307/358; 328/150; 340/663

[58] Field of Search ............ 307/350, 358, 362, 363, 307/296 R, 297; 328/147, 150, 259; 340/662, 663

[56] References Cited

U.S. PATENT DOCUMENTS 3,911,360  10/1975  Kimzey ........................ 307/358
4,260,907  4/1981  Winebarger ................. 307/358

Primary Examiner—John Zazworsky
Attorney, Agent, or Firm—Kane, Dalsimer, Kane, Sullivan & Kurucz

[57] ABSTRACT

A circuit for monitoring a d.c. voltage level and for generating a signal in the event the level falls below a fixed percentage of a desired level. The circuit utilizes a comparator, the inputs of which are fed by two leg resistive network the resistance values of which are in a ratio substantially equal to the percentage value. A capacitor is connected to the lower resistance value leg and to its input to the comparator. The output of the comparator is connected to one input of a second comparator the other input to which is connected to the capacitor. The output of the second comparator comprises the generated signal.

4 Claims, 2 Drawing Figures

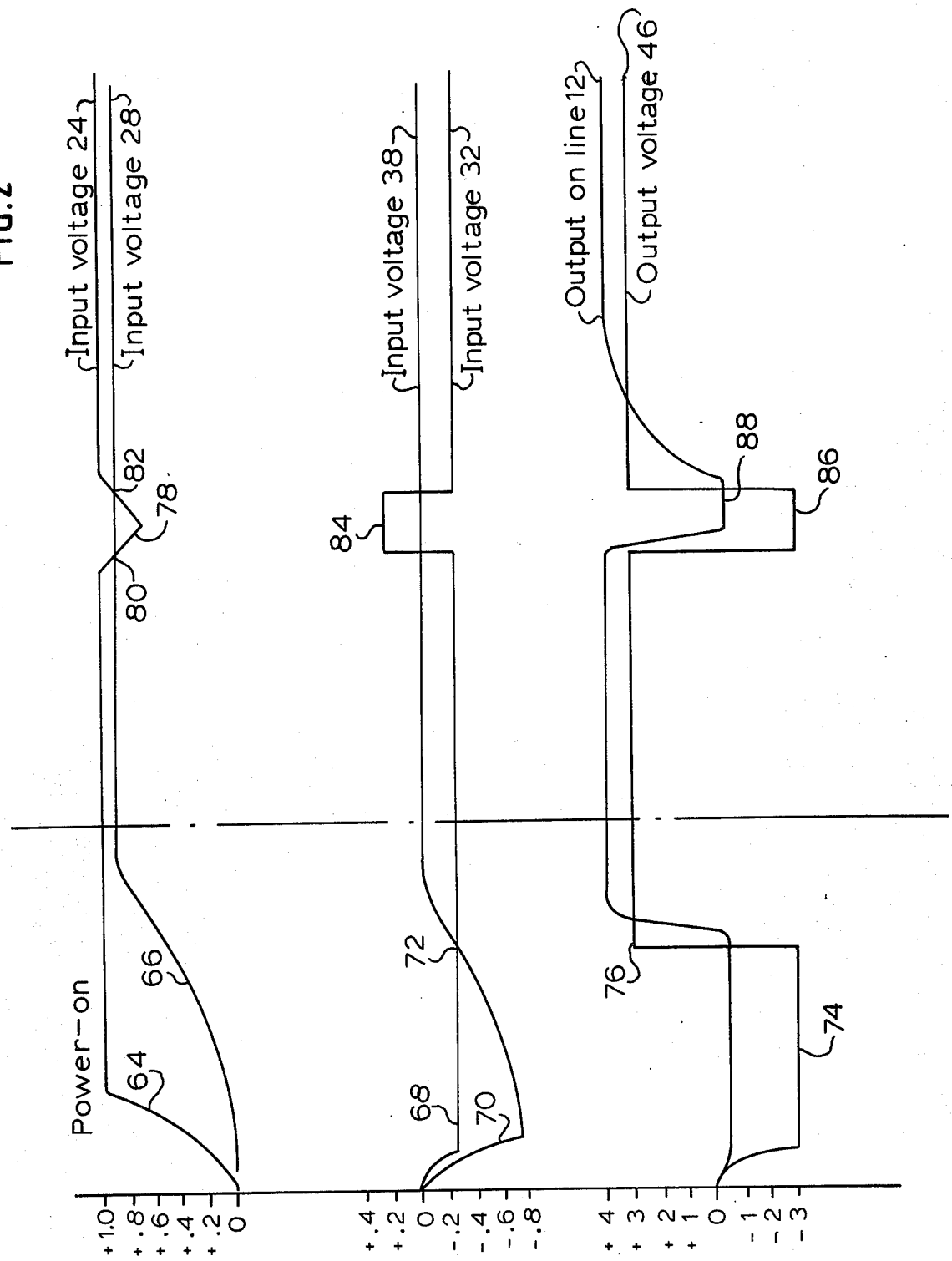

D.C. POWER MONITOR

BACKGROUND OF THE INVENTION

The present invention relates to a d.c. voltage monitor and in particular to a circuit for detecting voltage drops during power interruptions and start-up.

In certain applications wherein a D.C. supply voltage is utilized as a power supply, it is critical that the supply voltage not fall below a selected threshold. For example, in some microprocessor application it is desirable to have the power supply inhibited during any fall off from a preselected level rather than have the sensitive circuitry powered at an insufficient voltage level.

Heretofore, such critical voltages were commonly monitored by comparison to a fixed reference. When the voltage fell below the reference value a reset pulse was generated. The principal problem with such systems is that their sensitivity range is limited.

In view of the above, it is the principal object of the present invention to provide a D.C. supply voltage monitor circuit which does not rely on any fixed reference but rather uses a selectable reference which may be varied to provide a wide range of monitor sensitivity as required by the particular application.

A further object is to provide such a circuit which is relatively insensitive to set up tolerances.

Still another object is to provide such a circuit which may be assembled utilizing conventional and relatively inexpensive components.

Still other objects will be apparent from the following description.

SUMMARY OF THE INVENTION

The above and other beneficial objects and advantages are attained in accordance with the present invention by providing an improved d.c. voltage level monitoring circuit which comprises a resistive network with two legs for dividing the voltage to be monitored into two components having a ratio of values substantially equal to the percentage by which the actual d.c. voltage may drift from a desired level. The higher resistance leg feeds the negative input to a first comparator and the lower resistance leg feeds the positive input to the first comparator and a capacitor. The output of the first comparator feeds the negative input to a second comparator. The positive input to the second comparator is also connected to the capacitor.

The output of the second comparator changes state when the voltage level being monitored falls below the desired threshold as determined by resistance values of the legs of the resistive network.

BRIEF DESCRIPTION OF THE DRAWINGS

In the accompanying drawings;

FIG. 2 is a plot of voltage level vs. time at various points within the circuit.

DETAILED DESCRIPTION OF THE PREFERRED EMBODIMENT

Figure 1:
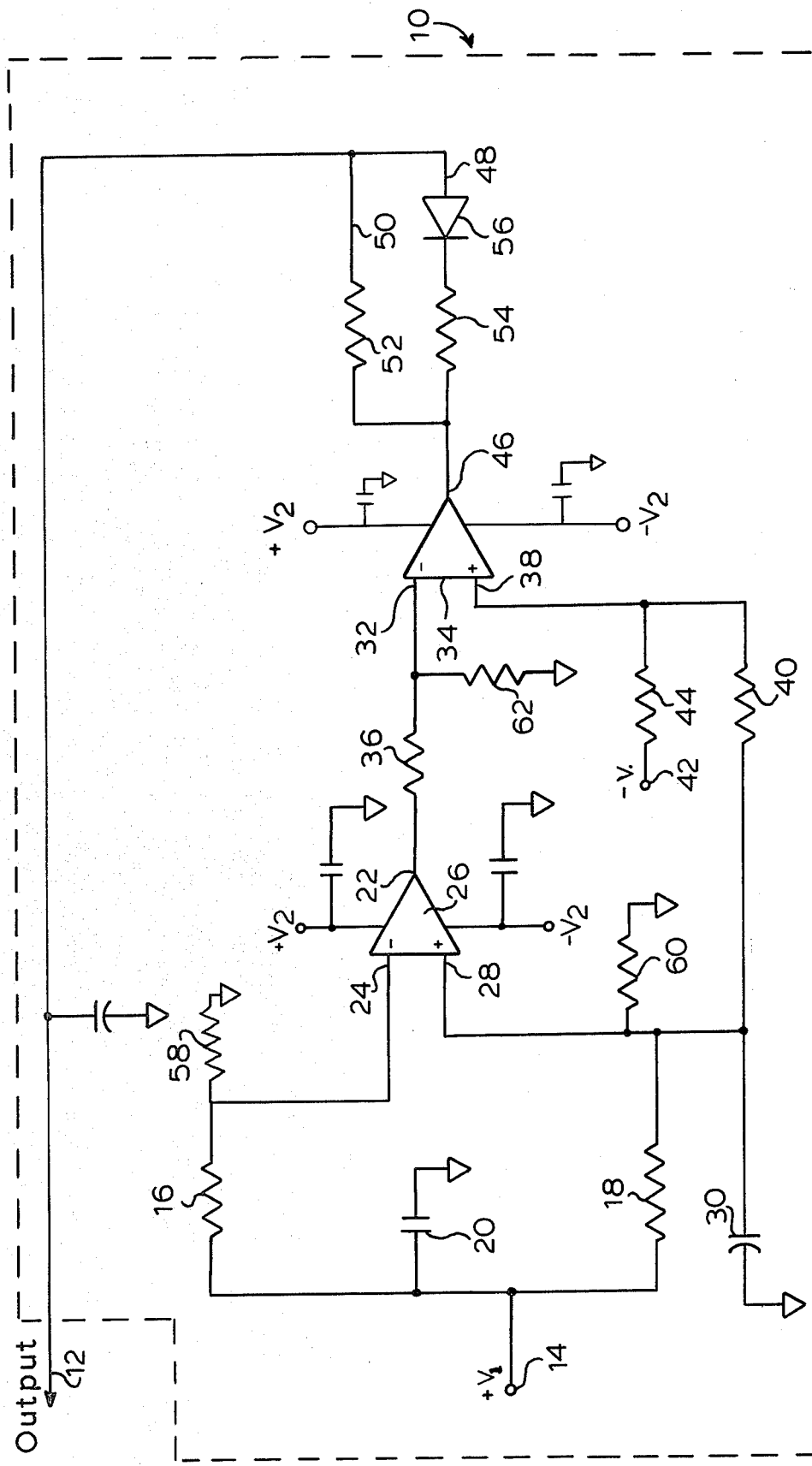
FIG. 1 is a circuit diagram of the present invention.

Reference is now made to FIG. 1 wherein a d.c. voltage monitor circuit 10 in accordance with the present invention is depicted. The circuit 10 operates to generate an inhibit signal on output line 12 when the supply voltage being monitored, $V_1$ falls below a predetermined percentage of its nominal value.

To this end, the supply voltage $V_1$ is applied to tap 14 at the juncture of resistors 16 and 18 which, each of which defines a voltage dividing subcircuit with resistors 58 and 60 respectively. The ratio of the value of resistor 18 to resistor 16 is slightly less than the allowable voltage drop percentage value. A noise suppressor, in the form of capacitor 20 is provided on the input tap 14.

Resistor 16 is connected to the negative tap 24 of an operational amplifier 26. Resistor 18 is connected to the positive tap 28 of amplifier 26. A capacitor 30 is also connected to the positive tap 28. The value of capacitor 30 is relatively high compared with that of capacitor 20. The output of amplifier 26 is fed to the negative input tap 32 of a second operational amplifier 34 through resistor 36. The positive input tap 38 of amplifier 34 is connected to capacitor 30 through a resistor 40. The positive tap 38 of amplifier 34 is also connected to the negative tap 42 of the supply voltage $V_1$ through resistor 44.

The operational amplifiers 26 and 34 may conveniently be on common chip and powered by a common power supply $+/-v_2$.

The output 46 of amplifier 34 is fed to the output line 12 through parallel legs 48 and 50. A resistor 52 is provided in leg 50. A resistor 54 and diode 56 are provided in leg 48. Diode 48 functions to extend the reset pulse on line 12. Resistors 58, 60 and 62 merely serve to reduce the voltage levels as required by amplifiers 26 and 34.

Operation of the present circuit may best be understood with reference to FIG. 2. As will be appreciated from the following description, operational amplifiers 26 and 34 act as comparators in the present circuit. That is, when the negative tap input voltage exceeds the positive tap input voltage the output of the operational amplifier is negative. When the output 46 of amplifier 34 is negative, the inhibit signal appears on line 12. This will occur if the voltage to the negative input tap 32 exceeds that to the positive input tap 38.

There are two conditions under which it is desirable to generate the inhibit signal: (1) during power turn-on while awaiting steady state and (2) during operation if an interruption occurs which reduces the voltage being monitored below the tolerable threshold percentage.

During power turn-on, the voltage 64 applied to pin 24 rises rapidly to its steady state value as shown. The voltage 66 applied to pin 28 rises more slowly because of the effect of the charging of capacitor 30. Eventually voltage 66 also reaches its steady state value, which will be lower than the level 64 because of the voltage difference in resistance values of resistors 16 and 18.

The voltage 68 applied to tap 32 causes the output 46 of amplifier 34 to go negative since it exceeds the voltage 70 applied to the positive tap 38 of amplifier 34. As capacitor 30 charges, however, it increases the value of voltage level 70 until voltage level 70 crosses voltage level 68 (at the point in time indicated by reference numeral 72). When this occurs, the output 46 of amplifier 34 switches from a negative value 74 to a positive value 76. After a brief delay (produced by diode 56) the output 88 on line 12 appears.

After start-up, if an interruption in the power supply causes $V_1$ to fall below the tolerable threshold percentage threshold, this will be represented by a dip 78 in the input voltage 64 to tap 24. The input voltage 66 will be uneffected because of capacitor 30. For the period of time between points 80 and 82 wherein the voltage level 66 exceeds the level 64 the output 22 of comparator 26 will be positive. As a result the voltage level 68 to tap 32 will exceed the voltage level 70 to tap 38 for the time duration indicated by numeral 84. The capacitor 30 prevents the voltage dip from affecting the input to tap 38. During this time period the output 86 of comparator 34 will go negative thereby producing a delayed inhibit 88 of the output on line 12. When the power interruption disappears, voltage level 64 once again exceeds level 66 so that voltage level 70 exceeds level 68 and the output of amplifier 34 becomes positive again.

In a successful practice of the invention wherein the operating voltage ranges were:

$V_1 = +5$ to $+15$ volts
$V_2 = +5$ to $+15$ volts
$-V_1 = -5$ to $-15$ volts
$-V_2 = -5$ to $-15$ volts The following formulas were found to provide resistance values to monitor a 5% voltage level drop in $V_1$.

$$R_{16} = \frac{(+V_1 - .96) K}{.096}$$

$$R_{18} = \frac{(+V_1 - .912) K}{.1012}$$

$$R_{44} = \frac{(-V_1) K}{.01}$$

$$R_{36} = \frac{(-V_2 + 2.25) K}{.025}$$

$$R_{52} = \frac{(+V_2) K}{.1}$$

$$R_{54} = \frac{(-V_2) K}{3.3}$$

-continued
$R_{40} = 91.2$ K
$R_{58} = R_{60} = R_{62} = 10$ K
$C_{20} = .1$ μf
$C_{30} = 22$ μf

Having thus described the invention, what is claimed is:

1. A circuit for monitoring a D.C. voltage level and for generating a signal in the event said voltage falls below a desired level by a predetermined percentage comprising:
   a two leg resistive network comprised of voltage dividers in each leg and connected at a juncture with a tap for the voltage to be monitored, the ratio of resistance values of said network legs being equal to said predetermined percentage;
   a first comparator having a first input tap connected to the higher resistance value leg of said resistive network, a second input tap connected to the other leg of said resistive network and an output tap;
   a second comparator having a first input tap connected to the output of the first comparator, a second input tap, and an output tap at which said signal appears; and,
   a capacitive element connected to the other leg of said resistive network and said second input tap.

2. The circuit in accordance with claim 1 wherein said capacitive element is further connected to said first comparator second input tap.

3. The circuit in accordance with claim 1 or 2 wherein the voltage to be monitored is positive and said comparators' first input taps comprise the negative inputs to said comparators and said comparators' second input taps comprise the positive inputs to the comparators.

4. The circuit of claim 1 wherein said desired level may be determined by selecting appropriate resistor values for the resistive network thereby allowing a range of monitor sensitivity.

* * * * *